United States Patent
Hsu et al.

(10) Patent No.: US 9,685,740 B1
(45) Date of Patent: Jun. 20, 2017

(54) WATERPROOF CONNECTOR

(71) Applicant: Cheng Uei Precision Industry Co., Ltd., New Taipei (TW)

(72) Inventors: Li Nien Hsu, New Taipei (TW); Chih Lin Yang, New Taipei (TW)

(73) Assignee: CHENG UEI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/293,249

(22) Filed: Oct. 13, 2016

(51) Int. Cl.
    H01R 13/52    (2006.01)
    H01R 13/6585  (2011.01)
    H05K 9/00     (2006.01)
    H05K 7/14     (2006.01)

(52) U.S. Cl.
    CPC ..... H01R 13/6585 (2013.01); H01R 13/5219 (2013.01); H05K 7/1401 (2013.01); H05K 9/0088 (2013.01)

(58) Field of Classification Search
    CPC ............ H01R 13/6585; H01R 13/6594; H01R 13/5219; H05K 9/0088; H05K 7/1401
    USPC ... 439/79, 271, 607.05, 607.35, 607.28, 660
    See application file for complete search history.

(56) References Cited

U.S. PATENT DOCUMENTS

| | | | |
|---|---|---|---|
| 9,425,558 B1 * | 8/2016 | Hsu ..................... | H01R 12/724 |
| 9,455,535 B1 * | 9/2016 | Chiang ............... | H01R 13/6585 |
| 9,525,243 B1 * | 12/2016 | Yuan ................... | H01R 13/6585 |
| 9,525,244 B1 * | 12/2016 | Hsu ..................... | H01R 13/6585 |
| 9,590,364 B1 * | 3/2017 | Chang ................ | H01R 13/6585 |

* cited by examiner

Primary Examiner — Khiem Nguyen
(74) Attorney, Agent, or Firm — Cheng-Ju Chiang

(57) ABSTRACT

A waterproof connector includes an upper terminal module, a shielding plate, a lower terminal module, a dielectric element, a shielding shell and an insulating housing. The shielding plate is mounted under the upper terminal module. The lower terminal module is mounted under the shielding plate. The dielectric element is integrally molded outside the upper terminal module, the shielding plate and the lower terminal module. The shielding shell surrounds the dielectric element together with the upper terminal module, the shielding plate and the lower terminal module. The insulating housing is integrally molded outside the shielding shell together with the upper terminal module, the shielding plate, the lower terminal module and the dielectric element.

18 Claims, 11 Drawing Sheets

WATERPROOF CONNECTOR

BACKGROUND OF THE INVENTION

1. Field of the Invention

The present invention generally relates to a connector, and more particularly to a waterproof connector.

2. The Related Art

Usually, a conventional waterproof connector generally includes an upper terminal module, a shielding plate, a lower terminal module, a shielding shell and an insulating housing. The upper terminal module includes an upper body and a plurality of upper terminals. The upper body is integrally molded outside the upper terminals. The lower terminal module includes a lower body and a plurality of lower terminals. The lower body is integrally molded outside the lower terminals. The upper terminal module, the shielding plate and the lower terminal module are arranged and assembled vertically. The shielding shell surrounds the upper terminal module, the shielding plate and the lower terminal module. The insulating housing is integrally molded to the upper terminal module, the shielding plate, the lower terminal module and the shielding shell.

However, a clearance is formed among the upper terminal module, the shielding plate and the lower terminal module that makes water easily seep into the conventional waterproof connector. As a result, the conventional waterproof connector has a worse waterproof performance.

Thus, whether the above-mentioned problem is solved by virtue of designing an innovative waterproof connector has become an important issue which is to be solved by skilled persons in the art, so the innovative waterproof connector having a reasonable design and effectively improving the above-mentioned problem is essential to be provided.

SUMMARY OF THE INVENTION

An object of the present invention is to provide a waterproof connector. The waterproof connector includes an upper terminal module, a shielding plate, a lower terminal module, a dielectric element, a shielding shell and an insulating housing. The upper terminal module includes an upper body and a plurality of upper terminals. The upper body is integrally molded outside the upper terminals. The upper terminals are arranged transversely. Top surfaces of front ends of the upper terminals are exposed to a top of the upper body. Tail ends of the upper terminals are exposed out of the upper body. A middle of a bottom surface of the upper body protrudes downward to form a protruding block. A middle of the protruding block is recessed inward to form a buckling groove. The shielding plate is mounted under the upper terminal module. A middle of the shielding plate opens an opening corresponding to the protruding block. The protruding block is locked in the opening. The lower terminal module mounted under the shielding plate, includes a lower body and a plurality of lower terminals. The lower body is integrally molded outside the lower terminals. The lower terminals are arranged transversely. Bottom surfaces of front ends of the lower terminals are exposed to a bottom of the lower body. Tail ends of the lower terminals are exposed out of the lower body. A middle of a top surface of the lower body protrudes upward to form a buckling block. The buckling block is buckled in the buckling groove. The dielectric element is integrally molded outside the upper terminal module, the shielding plate and the lower terminal module. The tail ends of the upper terminals and the tail ends of the lower terminals are exposed out of the dielectric element. The shielding shell surrounds the dielectric element together with the upper terminal module, the shielding plate and the lower terminal module. The insulating housing is integrally molded outside the shielding shell together with the upper terminal module, the shielding plate, the lower terminal module and the dielectric element.

As described above, the upper body is integrally molded outside the upper terminals, the lower body is integrally molded outside the lower terminals, the shielding plate is clamped between the upper body and the lower body by virtue of the upper body being buckled with the lower body, the dielectric element is integrally molded outside the upper terminal module, the shielding plate and the lower terminal module to seal up a clearance among the upper terminal module, the lower terminal module and the shielding plate, the shielding shell surrounds the dielectric element together with the upper terminal module, the shielding plate and the lower terminal module, the insulating housing is integrally molded outside the shielding shell together with the upper terminal module, the shielding plate, the lower terminal module and the dielectric element to seal up a clearance among the shielding shell, the upper terminal module, the shielding plate, the lower terminal module and the dielectric element, so that water hardly seeps into the waterproof connector by virtue of the waterproof connector adopting multiple integrative molding procedures to surround the upper terminals, the shielding plate, the lower terminals and the shielding shell therein. As a result, the waterproof connector has a better waterproof performance.

BRIEF DESCRIPTION OF THE DRAWINGS

The present invention will be apparent to those skilled in the art by reading the following description, with reference to the attached drawings, in which.

DETAILED DESCRIPTION OF THE PREFERRED EMBODIMENT

Figure 1:
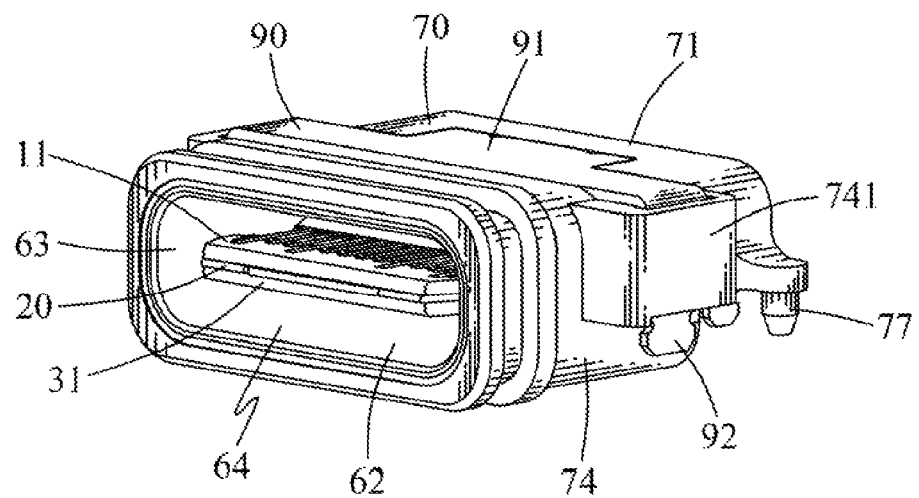
FIG. 1 is a perspective view of a waterproof connector in accordance with a preferred embodiment of the present invention.

With reference to FIG. 1 to FIG. 11, a waterproof connector 100 in accordance with a preferred embodiment of the present invention is shown. The waterproof connector 100 includes an upper terminal module 10, a shielding plate 20, a lower terminal module 30, a dielectric element 40, a shielding element 50, a shielding shell 60, an insulating housing 70, a filling body 80 and a pinboard 90.

Figure 2:
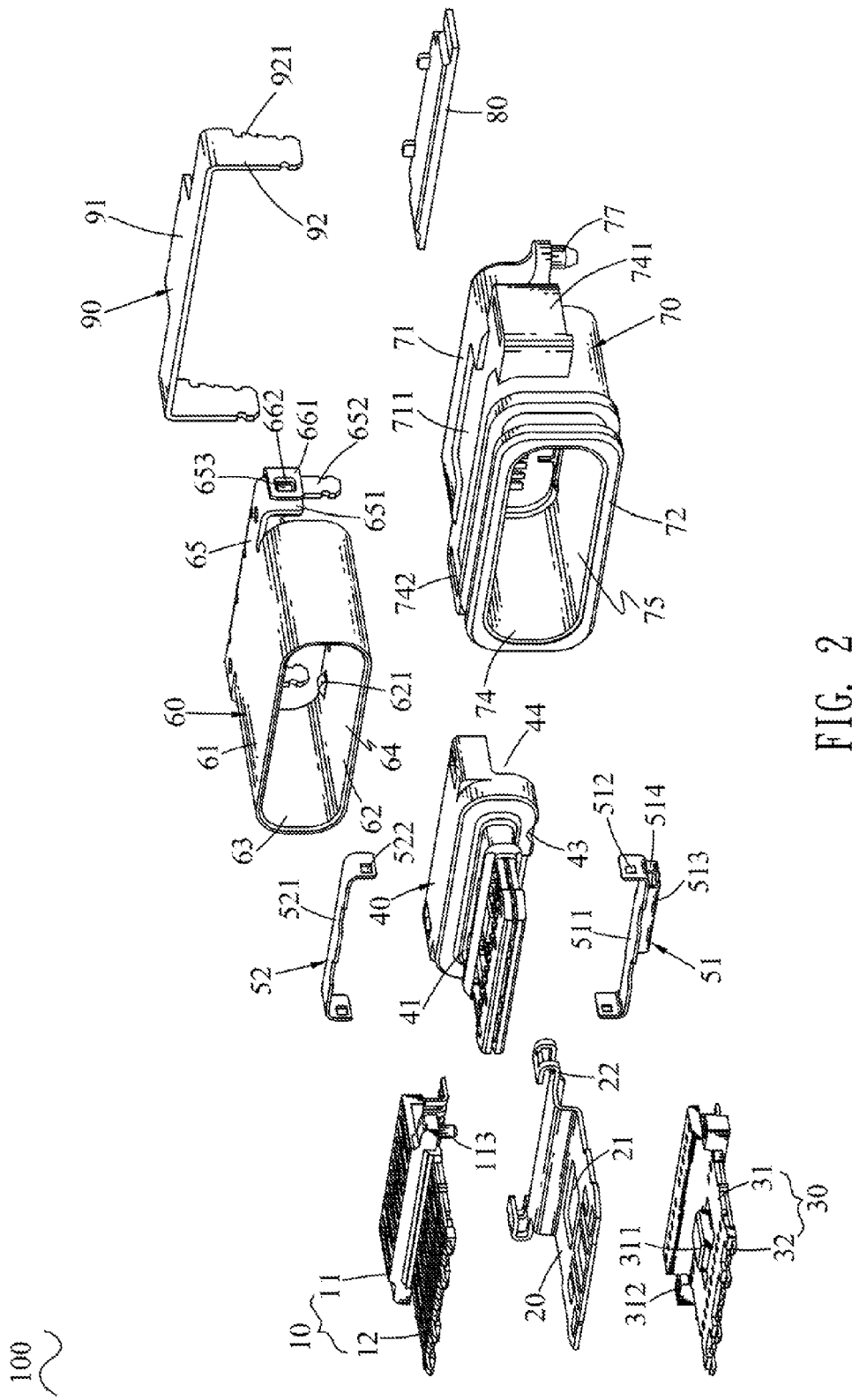
FIG. 2 is an exploded view of the waterproof connector of FIG. 1.
Figure 3:
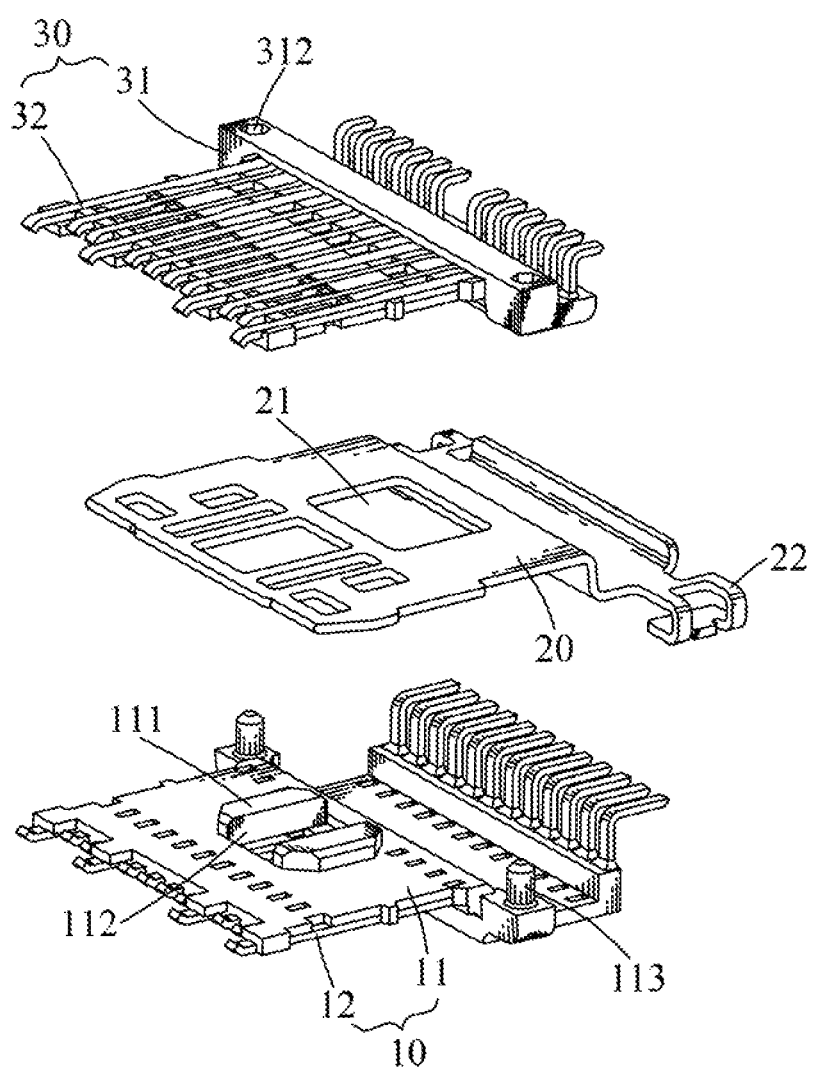
FIG. 3 is an exploded view showing an upper terminal module, a shielding plate and a lower terminal module of the waterproof connector of FIG. 1.

Referring to FIG. 2 and FIG. 3, the upper terminal module 10 includes an upper body 11 and a plurality of upper terminals 12. The upper body 11 is integrally molded outside the upper terminals 12. The upper terminals 12 are arranged transversely. Top surfaces of front ends of the upper terminals 12 are exposed to a top of the upper body 11 so as to electrically contact with a docking connector (not shown). Tail ends of the upper terminals 12 are exposed out of the upper body 11. A middle of a bottom surface of the upper body 11 protrudes downward to form a protruding block 111. A middle of the protruding block 111 is recessed inward to form a buckling groove 112. Two opposite sides of the bottom surface of the upper body 11 protrude downward to form two protruding pillars 113.

The shielding plate 20 is mounted under the upper terminal module 10. A middle of the shielding plate 20 opens an opening 21 corresponding to the protruding block 111 of the upper body 11. The protruding block 111 is locked in the opening 21. Two opposite sides of a rear end of the shielding plate 20 protrude outward to form two half-surrounded extending portions 22 with the mouths thereof facing each other. The two extending portions 22 of the shielding plate 20 project beyond two opposite sides of the upper body 11, respectively.

The lower terminal module 30 includes a lower body 31 and a plurality of lower terminals 32. The lower body 31 is integrally molded outside the lower terminals 32. The lower terminals 32 are arranged transversely. Bottom surfaces of front ends of the lower terminals 32 are exposed to a bottom of the lower body 31 so as to electrically contact with the docking connector. Tail ends of the lower terminals 32 are exposed out of the lower body 31. A middle of a top surface of the lower body 31 protrudes upward to form a buckling block 311 corresponding to the buckling groove 112 of the upper body 11. Two opposite sides of the lower body 31 define two insertion holes 312. The two insertion holes 312 are corresponding to the two protruding pillars 113, respectively.

Referring to FIG. 2, FIG. 3, FIG. 4 and FIG. 5, the lower terminal module 30 is mounted under the shielding plate 20. The buckling block 311 of the lower body 31 is buckled in the buckling groove 112 of the upper body 11. The protruding pillars 113 are inserted into the insertion holes 312, respectively. The two extending portions 22 of the shielding plate 20 project beyond two opposite sides of the lower body 31, respectively. So the shielding plate 20 is clamped between the upper body 11 of the upper terminal module 10 and the lower body 31 of the lower terminal module 30 by virtue of the upper body 11 of the upper terminal module 10 being buckled with the lower body 31 of the lower terminal module 30.

Figure 4:
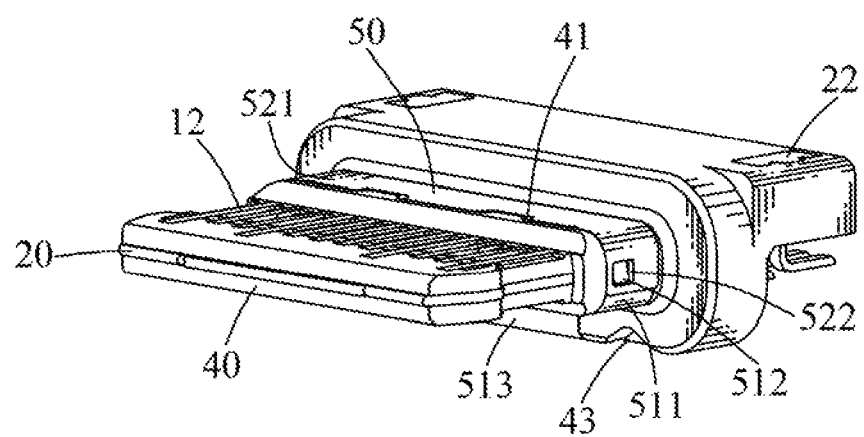
FIG. 4 is a perspective view showing the upper terminal module, the shielding plate, the lower terminal module, a dielectric element and a shielding element of the waterproof connector of FIG. 1.
Figure 5:
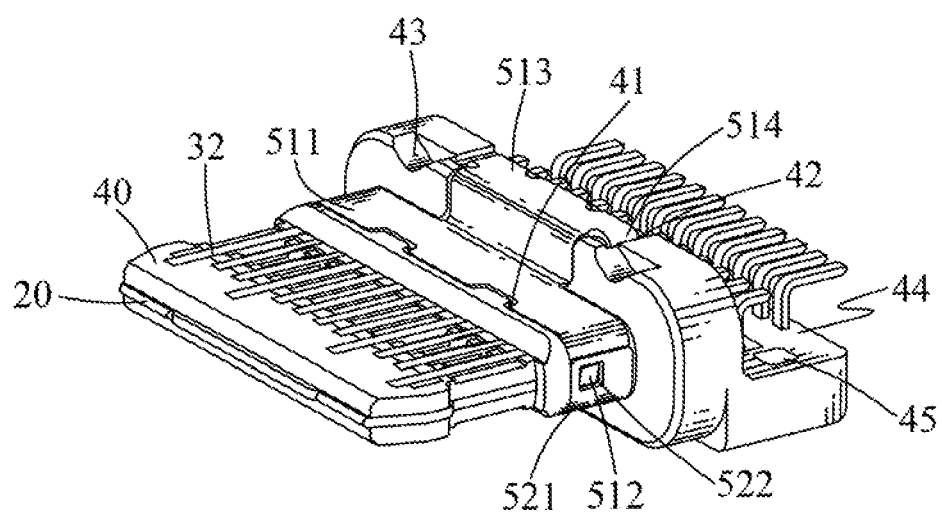
FIG. 5 is another perspective view showing the upper terminal module, the shielding plate, the lower terminal module, the dielectric element and the shielding element of the waterproof connector of FIG. 1.
Figure 6:
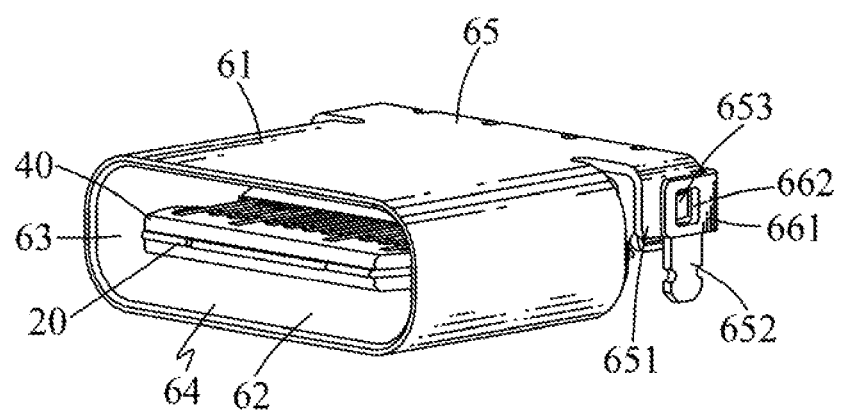
FIG. 6 is a partially perspective view of the waterproof connector of FIG. 1, wherein an insulating housing is omitted.
Figure 7:
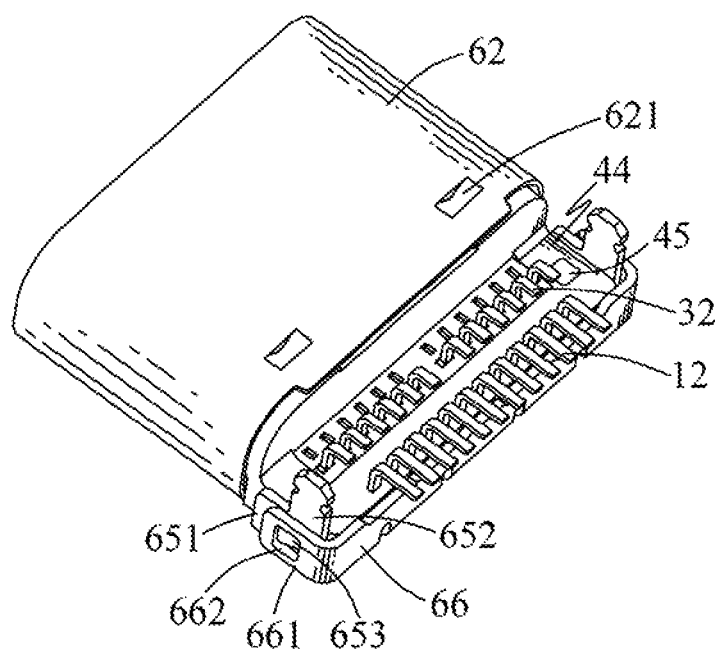
FIG. 7 is another partially perspective view of the waterproof connector of FIG. 1, wherein the insulating housing is omitted.
Figure 8:
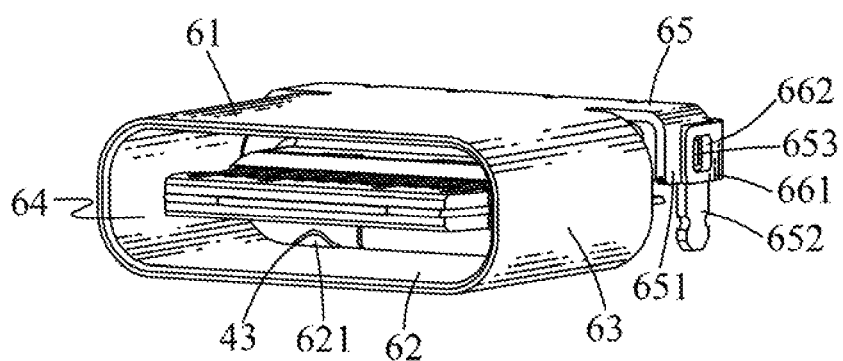
FIG. 8 is one more partially perspective view of the waterproof connector of FIG. 1, wherein the insulating housing is omitted.
Figure 9:
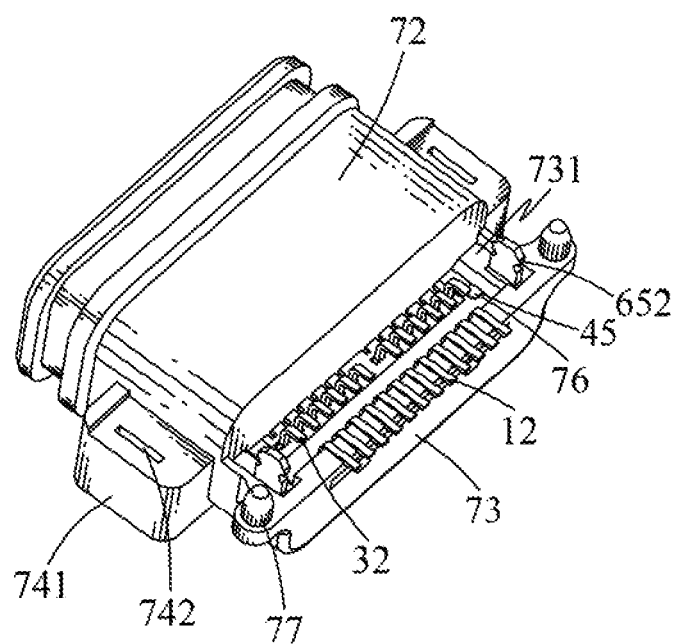
FIG. 9 is a perspective view of the waterproof connector of FIG. 1, wherein the insulating housing is located on an outside of the waterproof connector.

Referring to FIG. 2, FIG. 4 and FIG. 5, the dielectric element 40 is integrally molded outside the upper terminal module 10, the shielding plate 20 and the lower terminal module 30. A front end of the shielding plate 20 projects beyond a front surface of the dielectric element 40 so as to make the docking connector contact with the shielding plate 20 directly when the waterproof connector 100 is interconnected with the docking connector for effectively preventing the docking connector abutting against the front surface of the dielectric element 40 directly to result in a deformation of the waterproof connector 100.

Top surfaces of the extending portions 22 of the shielding plate 20 are exposed to a top surface of the dielectric element 40. A periphery of a substantial middle of the dielectric element 40 is recessed inward to form a ring-shaped assembling groove 41. Two opposite sides of a bottom surface of the dielectric element 40 are recessed inward to form two fastening holes 42 communicated with the assembling groove 41. The two opposite sides of the bottom surface of the dielectric element 40 are recessed inward to form two blocking grooves 43. The two fastening holes 42 are substantially located between the two blocking grooves 43. A rear end of the bottom surface of the dielectric element 40 is recessed inward to form a lacking groove 44. The tail ends of the upper terminals 12 and the tail ends of the lower terminals 32 are exposed out of the dielectric element 40 and are located in the lacking groove 44. Two opposite sides of a bottom of a top wall of the lacking groove 44 define two fastening grooves 45.

Referring to FIG. 2, FIG. 4 and FIG. 5, the shielding element 50 includes a lower shielding element 51 and an upper shielding element 52. The lower shielding element 51 has a substantially U-shaped lower assembling portion 511. Two opposite sides of the lower assembling portion 511 are punched outward to form two buckling pieces 512, respectively. A rear end of the lower assembling portion 511 is bent downward and then bent rearward to form a connecting portion 513. Two opposite sides of a rear end of the connecting portion 513 is bent upward to form two fastening portions 514. The upper shielding element 52 has a substantially n-shaped upper assembling portion 521. Two opposite sides of the upper assembling portion 521 open two buckling holes 522, respectively. The lower assembling portion 511 with the buckling pieces 512 is assembled in a lower portion of the assembling groove 41. The connecting portion 513 is disposed to a lower portion of a rear end of the dielectric element 40. The two fastening portions 514 are fastened in the two fastening holes 42. The upper assembling portion 521 is assembled in an upper portion of the assembling groove 41. The two buckling pieces 512 are buckled in the two buckling holes 522. The two opposite sides of the upper assembling portion 521 are fastened to the two opposite sides of the lower assembling portion 511 by a spot soldering way.

Referring to FIG. 2, FIG. 4, FIG. 6, FIG. 7 and FIG. 8, the shielding shell 60 surrounds the dielectric element 40 together with the upper terminal module 10, the shielding plate 20, the lower terminal module 30 and the shielding element 50. The shielding shell 60 has a top plate 61, a bottom plate 62 and two lateral plates 63. An insertion space 64 is formed among the top plate 61, the bottom plate 62 and the two lateral plates 63. The dielectric element 40 together with the upper terminal module 10, the shielding plate 20, the lower terminal module 30 and the shielding element 50 is inserted into the insertion space 64 of the shielding shell 60. Two sides of the bottom plate 62 of the shielding shell 60 are punched upward to form two blocking portions 621 corresponding to the two blocking grooves 43, respectively. The two blocking portions 621 are blocked in the two blocking grooves 43, respectively for preventing the dielectric element 40 from moving frontward to fall off from the shielding shell 60.

The bottom plate 62 of the shielding shell 60 contacts the lower shielding element 51. The bottom plate 62 of the shielding shell 60 is fastened to the lower shielding element 51 by the spot soldering way. A rear end of the top plate 61 extends rearward and then extends oppositely to form a connecting plate 65. Two opposite sides of the connecting plate 65 are bent downward to form two clamping plates 651. Bottom edges of the two clamping plates 651 extend downward to form two insertion feet 652. The two clamping plates 651 are punched outward to form two restricting blocks 653, respectively.

The connecting plate 65 is covered on the top surface of the dielectric element 40 and the two clamping plates 651 are attached to two side surfaces of the dielectric element 40. The connecting plate 65 of the shielding shell 60 contacts the extending portions 22 of the shielding plate 20. The connecting plate 65 of the shielding shell 60 is fastened to the extending portions 22 by the spot soldering way. A rear end of the connecting plate 65 is bent downward to form a rear plate 66. Two opposite sides of the rear plate 66 are bent frontward to form two restricting pieces 661. The two restricting pieces 661 of the shielding shell 60 open two restricting holes 662, respectively. The rear plate 66 of the shielding shell 60 is attached to a rear surface of the dielectric element 40. The two restricting pieces 661 are fastened to outer surfaces of the two clamping plates 651, respectively. The two restricting blocks 653 are restricted in the two restricting holes 662, respectively.

Referring to FIG. 1, FIG. 2, FIG. 4, FIG. 9 and FIG. 11, the insulating housing 70 is integrally molded outside the shielding shell 60 together with the upper terminal module 10, the shielding plate 20, the lower terminal module 30 and the dielectric element 40. The insulating housing 70 has a top board 71, a bottom board 72, a rear board 73 and two side boards 74. An accommodating space 75 is formed among the top board 71, the bottom board 72, the rear board 73 and the two side boards 74. The upper terminal module 10, the shielding plate 20, the lower terminal module 30, the dielectric element 40, the shielding element 50 and the shielding shell 60 are accommodated in the accommodating space 75. A rear end of a bottom of the insulating housing 70 is recessed inward to form a receiving space 731. The tail ends of the upper terminals 12 of the upper terminal module 10, the tail ends of the lower terminals 32 of the lower terminal module 30 and the insertion feet 652 of the shielding shell 60 are received in the receiving space 731.

Outer peripheries of two portions of a top wall of the receiving space 731 respectively molded around the two insertion feet 652 are chamfered to facilitate the insertion feet 652 for realizing a limiting action. A junction between a bottom surface and an inner surface of each side wall of the receiving space 731 connected with the lower body 31 of the lower terminal module 30 is chamfered for guiding molten plastics flowing towards the lower terminal module 30. The inner surfaces of the two side walls of the receiving space 731 form two fastening pillars 76 corresponding to the two fastening grooves 45, respectively. The two fastening pillars 76 are fastened in the two fastening grooves 45, respectively. Two opposite sides of a bottom of the top board 71 of the insulating housing 70 protrude downward to form two insertion pillars 77 located adjacent to and spaced from outer sides of the two insertion feet 652. A top surface of the top board 71 of the insulating housing 70 is recessed inward to form a locating groove 711. Two opposite sides of a front end of the locating groove 711 extend outward and beyond two opposite sides of a rear end of the locating groove 711, respectively. The two side boards 74 of the insulating housing 70 protrude outward to form two locating blocks 741, respectively. Each of the locating blocks 741 opens a locating hole 742 extending vertically.

Figure 10:
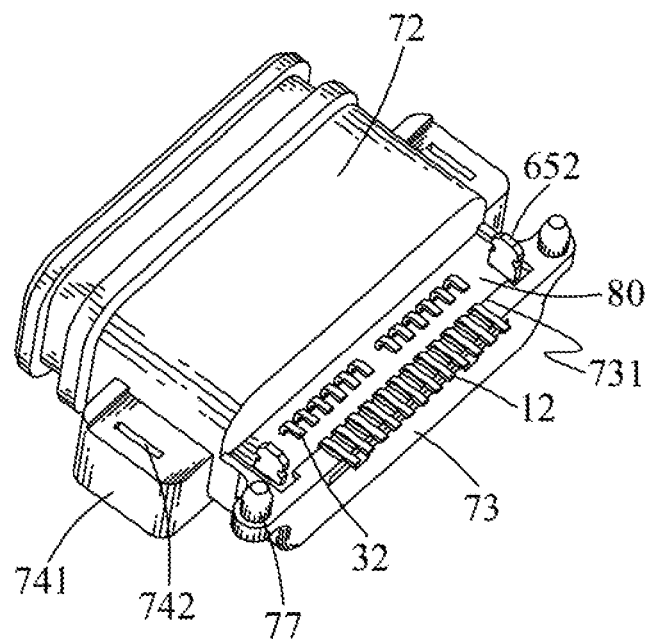
FIG. 10 is a perspective view of the waterproof connector of FIG. 1, wherein a filling body is filled into the waterproof connector.
Figure 11:
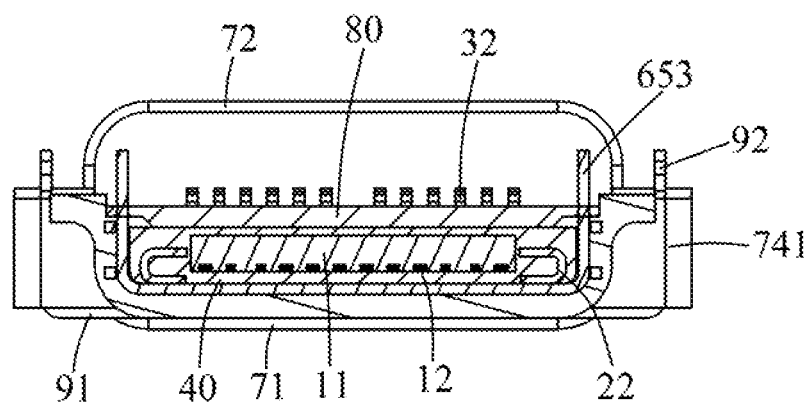
FIG. 11 is a sectional view of the waterproof connector of FIG. 1.

Referring to FIG. 2 and FIG. 10, the filling body 80 is filled in the receiving space 731 of the insulating housing 70. The two insertion feet 652 of the shielding shell 60, the tail ends of the upper terminals 12 of the upper terminal module 10 and the tail ends of the lower terminals 32 of the lower terminal module 30 are exposed out of the filling body 80.

Referring to FIG. 1, FIG. 2 and FIG. 10, the pinboard 90 has a locating board 91. Two opposite sides of a front end of the locating board 91 extend outward and beyond two opposite sides of a rear end of the locating board 91 for increasing an adsorption area to make a suction nozzle adsorb the waterproof connector 100 more stably. Two opposite sides of the locating board 91 are bent downward to form two locating feet 92. Several portions of a rear edge of each of the locating feet 92 protrude rearward to form a plurality of barbs 921. The locating board 91 is located in the locating groove 711 of the insulating housing 70. The two locating feet 92 are inserted into the two locating holes 742 of the two locating blocks 741. The barbs 921 of the two locating feet 92 interfere with inner walls of the two locating holes 742, respectively, for preventing the pinboard 90 breaking upward away from the insulating housing 70.

As described above, the upper body 11 is integrally molded outside the upper terminals 12, the lower body 31 is integrally molded outside the lower terminals 32, the shielding plate 20 is clamped between the upper body 11 of the upper terminal module 10 and the lower body 31 of the lower terminal module 30 by virtue of the upper body 11 being buckled with the lower body 31, the dielectric element 40 is integrally molded outside the upper terminal module 10, the shielding plate 20 and the lower terminal module 30 to seal up a clearance among the upper terminal module 10, the lower terminal module 30 and the shielding plate 20, the shielding shell 60 surrounds the dielectric element 40 together with the upper terminal module 10, the shielding plate 20 and the lower terminal module 30, the insulating housing 70 is integrally molded outside the shielding shell 60 together with the upper terminal module 10, the shielding plate 20, the lower terminal module 30 and the dielectric element 40 to seal up a clearance among the shielding shell 60, the upper terminal module 10, the shielding plate 20, the lower terminal module 30 and the dielectric element 40, so that water hardly seeps into the waterproof connector 100 by virtue of the waterproof connector 100 adopting multiple integrative molding procedures to surround the upper terminals 12, the shielding plate 20, the lower terminals 32 and the shielding shell 60 therein. As a result, the waterproof connector 100 has a better waterproof performance.

What is claimed is:
1. A waterproof connector, comprising:
   an upper terminal module including an upper body and a plurality of upper terminals, the upper body being integrally molded outside the upper terminals, the upper terminals being arranged transversely, top surfaces of front ends of the upper terminals being exposed to a top of the upper body, tail ends of the upper terminals being exposed out of the upper body, a middle of a bottom surface of the upper body protruding downward to form a protruding block, a middle of the protruding block being recessed inward to form a buckling groove;

a shielding plate mounted under the upper terminal module, a middle of the shielding plate having an opening corresponding to the protruding block, the protruding block being locked in the opening;

a lower terminal module mounted under the shielding plate, including a lower body and a plurality of lower terminals, the lower body being integrally molded outside the lower terminals, the lower terminals being arranged transversely, bottom surfaces of front ends of the lower terminals being exposed to a bottom of the lower body, tail ends of the lower terminals being exposed out of the lower body, a middle of a top surface of the lower body protruding upward to form a buckling block, the buckling block being buckled in the buckling groove;

a dielectric element integrally molded outside the upper terminal module, the shielding plate and the lower terminal module, the tail ends of the upper terminals and the tail ends of the lower terminals being exposed out of the dielectric element;

a shielding shell surrounding the dielectric element together with the upper terminal module, the shielding plate and the lower terminal module; and an insulating housing integrally molded outside the shielding shell together with the upper terminal module, the shielding plate, the lower terminal module and the dielectric element.

2. The waterproof connector as claimed in claim 1, wherein two opposite sides of the bottom surface of the upper body protrude downward to form two protruding pillars, two opposite sides of the lower body define two insertion holes, the two protruding pillars are inserted into the two insertion holes, respectively.

3. The waterproof connector as claimed in claim 1, wherein two opposite sides of a rear end of the shielding plate protrude outward to form two extending portions, the two extending portions project beyond two opposite sides of the upper body, respectively and project beyond two opposite sides of the lower body, respectively, top surfaces of the extending portions are exposed to a top surface of the dielectric element, the shielding shell contacts the extending portions, the shielding shell is fastened to the extending portions by a spot soldering way.

4. The waterproof connector as claimed in claim 1, wherein a periphery of a substantial middle of the dielectric element is recessed inward to form a ring-shaped assembling groove, the waterproof connector further includes a shielding element which includes a lower shielding element and an upper shielding element, the lower shielding element has a substantially U-shaped lower assembling portion, two opposite sides of the lower assembling portion are punched outward to form two buckling pieces, respectively, the upper shielding element has a substantially n-shaped upper assembling portion, two opposite sides of the upper assembling portion open two buckling holes, respectively, the lower assembling portion with the buckling pieces is assembled in a lower portion of the assembling groove, the upper assembling portion is assembled in an upper portion of the assembling groove, the two buckling pieces are buckled in the two buckling holes, the two opposite sides of the upper assembling portion are fastened to the two opposite sides of the lower assembling portion by a spot soldering way.

5. The waterproof connector as claimed in claim 4, wherein the shielding shell surrounds the dielectric element together with the shielding element, the shielding shell is fastened to the lower shielding element by the spot soldering way.

6. The waterproof connector as claimed in claim 4, wherein a rear end of the lower assembling portion is bent downward and then bent rearward to form a connecting portion, the connecting portion is disposed to a lower portion of a rear end of the dielectric element.

7. The waterproof connector as claimed in claim 6, wherein two opposite sides of a bottom surface of the dielectric element are recessed inward to form two fastening holes communicated with the assembling groove, two opposite sides of a rear end of the connecting portion is bent upward to form two fastening portions, the two fastening portions are fastened in the two fastening holes.

8. The waterproof connector as claimed in claim 1, wherein the shielding shell has a top plate, a bottom plate and two lateral plates, an insertion space is formed among the top plate, the bottom plate and the two lateral plates, the dielectric element together with the upper terminal module, the shielding plate and the lower terminal module is inserted into the insertion space.

9. The waterproof connector as claimed in claim 8, wherein two opposite sides of a bottom surface of the dielectric element are recessed inward to form two blocking grooves, two sides of the bottom plate of the shielding shell are punched upward to form two blocking portions, respectively, the two blocking portions are blocked in the two blocking grooves, respectively.

10. The waterproof connector as claimed in claim 8, wherein a rear end of the top plate of the shielding shell extends rearward and then extends oppositely to form a connecting plate, two opposite sides of the connecting plate are bent downward to form two clamping plates attached to two side surfaces of the dielectric element, two opposite sides of the rear plate of the shielding shell are bent frontward to form two restricting pieces, the rear plate is attached to a rear surface of the dielectric element, the two restricting pieces are fastened to outer surfaces of the two clamping plates, respectively.

11. The waterproof connector as claimed in claim 10, wherein the two clamping plates are punched outward to form two restricting blocks, respectively, the two restricting pieces open two restricting holes, respectively, the two restricting blocks are restricted in the two restricting holes, respectively.

12. The waterproof connector as claimed in claim 10, wherein bottom edges of the two clamping plates extend downward to form two insertion feet, the insulating housing has a top board, a bottom board, a rear board and two side boards, an accommodating space is formed among the top board, the bottom board, the rear board and the two side boards, the upper terminal module, the shielding plate, the lower terminal module, the dielectric element and the shielding shell are accommodated in the accommodating space, a rear end of a bottom of the insulating housing is recessed inward to form a receiving space, the tail ends of the upper terminals, the tail ends of the lower terminals and the insertion feet are received in the receiving space.

13. The waterproof connector as claimed in claim 12, wherein a rear end of a bottom surface of the dielectric element is recessed inward to form a lacking groove, the tail ends of the upper terminals and the tail ends of the lower terminals are located in the lacking groove.

14. The waterproof connector as claimed in claim 13, wherein two opposite sides of a bottom of a top wall of the lacking groove define two fastening grooves, inner surfaces of two side walls of the receiving space form two fastening pillars, the two fastening pillars are fastened in the two fastening grooves, respectively.

15. The waterproof connector as claimed in claim 12, wherein a top surface of the top board of the insulating housing is recessed inward to form a locating groove, the waterproof connector further includes a pinboard which has a locating board, two opposite sides of a front end of the locating board extend outward and beyond two opposite sides of a rear end of the locating board, the locating board is located in the locating groove.

16. The waterproof connector as claimed in claim 15, wherein the two side boards of the insulating housing protrude outward to form two locating blocks, respectively, each of the locating blocks opens a locating hole, two opposite sides of the locating board are bent downward to form two locating feet, the two locating feet are inserted into the two locating holes of the two locating blocks.

17. The waterproof connector as claimed in claim 16, wherein several portions of a rear edge of each of the locating feet protrude rearward to form a plurality of barbs, the barbs of the two locating feet interfere with inner walls of the two locating holes, respectively.

18. The waterproof connector as claimed in claim 12, further comprising a filling body, the filling body being filled in the receiving space of the insulating housing, the two insertion feet, the tail ends of the upper terminals and the tail ends of the lower terminals are exposed out of the filling body.

\* \* \* \* \*